(12) United States Patent
Makino et al.

(10) Patent No.: US 11,789,094 B2
(45) Date of Patent: **\*Oct. 17, 2023**

(54) MAGNETIC SENSOR DEVICE AND MAGNETIC SENSOR SYSTEM

(71) Applicant: TDK CORPORATION, Tokyo (JP)

(72) Inventors: Kenzo Makino, Tokyo (JP); Shuhei Miyazaki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/959,392

(22) Filed: Oct. 4, 2022

(65) Prior Publication Data

US 2023/0028190 A1 Jan. 26, 2023

Related U.S. Application Data

(63) Continuation of application No. 17/218,430, filed on Mar. 31, 2021, now Pat. No. 11,493,567.

(51) Int. Cl.
*G01R 33/02* (2006.01)

(52) U.S. Cl.
CPC ................ *G01R 33/0206* (2013.01)

(58) Field of Classification Search
CPC .......... G01R 33/00; G01R 33/0035; G01R 33/0023; G01R 33/0017; G01R 31/3191; G01R 33/0206; G01B 7/004; G01C 17/38; G06F 3/017; G06F 3/0346; G06F 3/012
See application file for complete search history.

(56) References Cited

U.S. PATENT DOCUMENTS

| | | | |
|---|---|---|---|
| 7,126,330 B2 * | 10/2006 | Peczalski | G01R 33/0206 324/252 |
| 10,276,289 B1 | 4/2019 | Kirby et al. | |
| 2005/0122100 A1 * | 6/2005 | Wan | G01R 33/0206 324/262 |
| 2008/0262303 A1 * | 10/2008 | Minai | A61B 5/062 600/117 |
| 2009/0027048 A1 | 1/2009 | Sato et al. | |
| 2010/0259257 A1 | 10/2010 | Sasaki et al. | |
| 2014/0247042 A1 | 9/2014 | Lei et al. | |
| 2015/0091560 A1 | 4/2015 | Deak et al. | |
| 2015/0285873 A1 * | 10/2015 | Cai | G01R 33/0005 324/252 |
| 2016/0327617 A1 | 11/2016 | Deak et al. | |

FOREIGN PATENT DOCUMENTS

| | | |
|---|---|---|
| JP | 2002-071775 A | 3/2002 |
| JP | 2008-216181 A | 9/2008 |
| JP | 2009-122049 A | 6/2009 |

* cited by examiner

*Primary Examiner* — Jermele M Hollington
*Assistant Examiner* — Taqi R Nasir
(74) *Attorney, Agent, or Firm* — Oliff PLC

(57) ABSTRACT

A magnetic sensor device includes a first chip including a first magnetic sensor, a second chip including a second magnetic sensor and a third magnetic sensor, and a support having a reference plane. The first magnetic sensor includes at least one first magnetic detection element, and detects a first component of an external magnetic field. The second magnetic sensor includes at least one second magnetic detection element, and detects a second component of the external magnetic field. The third magnetic sensor includes at least one third magnetic detection element, and detects a third component of the external magnetic field. The first chip and the second chip are mounted on the reference plane.

39 Claims, 9 Drawing Sheets

MAGNETIC SENSOR DEVICE AND MAGNETIC SENSOR SYSTEM

This application is a continuation of U.S. application Ser. No. 17/218,430, filed on Mar. 31, 2021, the entire disclosure of which is hereby incorporated by reference in its entirety.

BACKGROUND

The technology relates to a magnetic sensor device that detects components of an external magnetic field in three mutually different directions.

A magnetic sensor device for detecting components in a plurality of directions of an applied magnetic field has recently been used in a variety of applications. One example of the applications of the magnetic sensor device includes a magnetic position detection device that detects the position of a magnet movable in three dimensions.

The magnetic position detection device includes, for example, a magnetic sensor device, a magnet movable along a predetermined spherical surface around the magnetic sensor device, and a signal processing circuit. The magnetic sensor device detects three components in three mutually different directions of a magnetic field generated by the magnet and applied to the magnetic sensor device, and generates three detection signals corresponding to the three components. Based on the three detection signals, the signal processing circuit generates position information indicating the position of the magnet.

US 2009/0027048 A1 discloses a three-axial magnetic sensor having an X-axial sensor, a Y-axial sensor, and a Z-axial sensor formed in a chip. JP 2008-216181 A discloses a direction sensor in which a first magnetic sensor, a second magnetic sensor, and a third magnetic sensor are disposed on a flat substrate.

Incidentally, in use of the position detection device, unintended external forces are applied, in some cases, to a substrate on which the magnetic sensor device is mounted. In this case, the substrate is distorted, and a stress is applied to the magnetic sensor device. As a result, there are occasions where a detection signal of the magnetic sensor device generates an error.

As a method for reducing the effect of the stress applied to the magnetic sensor device, it is conceivable to divide a chip in which magnetic detection elements are formed, for the purpose of reducing the size of individual chips. However, an increase in the number of chips causes an increase in the number of processing steps, and thus may increase cost of the magnetic sensor device.

SUMMARY

An object of the technology is to provide a magnetic sensor device and a magnetic sensor system that can reduce the effect of an applied stress, while preventing a cost increase.

A magnetic sensor device according to the technology includes a first chip including a first magnetic sensor, a second chip including a second magnetic sensor and a third magnetic sensor, and a support having a reference plane. The first magnetic sensor includes at least one first magnetic detection element and detects a first component of an external magnetic field. The first component is a component of the external magnetic field in a first direction being a direction parallel to the reference plane. The second magnetic sensor includes at least one second magnetic detection element and detects a second component of the external magnetic field. The second component is a component of the external magnetic field in a second direction being a direction inclined with respect to each of the reference plane and a direction perpendicular to the reference plane. The third magnetic sensor includes at least one third magnetic detection element and detects a third component of the external magnetic field. The third component is a component of the external magnetic field in a third direction being another direction inclined with respect to each of the reference plane and the direction perpendicular to the reference plane. The first chip and the second chip are mounted on the reference plane.

In the magnetic sensor device according to the technology, the at least one first magnetic detection element may be disposed on a flat surface that is parallel to the reference plane. The at least one second magnetic detection element and the at least one third magnetic detection element may be disposed on an inclined surface that is inclined with respect to the reference plane.

In the magnetic sensor device according to the technology, the first chip and the second chip may be disposed with a predetermined gap therebetween. In this case, the first chip and the second chip may be disposed such that, when viewed from the direction perpendicular to the reference plane, a virtual straight line passing through the gap and having the same distance from the first chip and from the second chip does not cross the barycenter of the support.

In the magnetic sensor device according to the technology, the planar shape of the first chip viewed from the direction perpendicular to the reference plane may be smaller in size than the planar shape of the second chip viewed from the direction perpendicular to the reference plane. In this case, the first chip may include a first element arrangement area in which the at least one first magnetic detection element is disposed. The second chip may include a second element arrangement area in which the at least one second magnetic detection element and the at least one third magnetic detection element are disposed. The first element arrangement area may be ½ or less of the second element arrangement area in size.

In the magnetic sensor device according to the technology, each of the first chip and the second chip may have a planar shape long in a direction orthogonal to the direction of alignment of the first chip and the second chip, when viewed from the direction perpendicular to the reference plane. In this case, each of the first chip and the second chip may be disposed such that, when viewed from the direction perpendicular to the reference plane, a virtual straight line passing through the barycenter of the first chip and the barycenter of the second chip is in parallel with the direction of alignment of the first chip and the second chip.

In the magnetic sensor device according to the technology, each of the first chip and the second chip may have a planar shape long in one direction, when viewed from the direction perpendicular to the reference plane. In this case, the first chip may have a plurality of first pads disposed in the vicinity of both ends of the first chip in a longitudinal direction of the first chip. The second chip may have a plurality of second pads disposed in the vicinity of both ends of the second chip in a longitudinal direction of the second chip. The support may have a plurality of third pads disposed on the reference plane. Part of the plurality of third pads may be disposed on both sides of the first chip in the longitudinal direction of the first chip. Other part of the plurality of third pads may be disposed on both sides of the second chip in the longitudinal direction of the second chip.

In the magnetic sensor device according to the technology, the second chip may have a planar shape long in one direction, when viewed from the direction perpendicular to the reference plane. In this case, the second chip may include a second element arrangement area in which the at least one second magnetic detection element and the at least one third magnetic detection element are disposed. When viewed from the direction perpendicular to the reference plane, the second element arrangement area may have a planar shape long in a direction orthogonal to the longitudinal direction of the planar shape of the second chip.

In the magnetic sensor device according to the technology, the dimension of the first chip in the direction perpendicular to the reference plane and the dimension of the second chip in the direction perpendicular to the reference plane may be the same.

In the magnetic sensor device according to the technology, the dimension of the support in the direction perpendicular to the reference plane may be larger than the dimension of the first chip in the direction perpendicular to the reference plane and the dimension of the second chip in the direction perpendicular to the reference plane.

In the magnetic sensor device according to the technology, the first magnetic sensor may generate at least one first detection signal having a correspondence with the first component. The second magnetic sensor may generate at least one second detection signal having a correspondence with the second component. The third magnetic sensor may generate at least one third detection signal having a correspondence with the third component. In this case, the support may include a processor. The processor may generate a first detection value corresponding to the first component based on the at least one first detection signal, and also generate a second detection value corresponding to a component of the external magnetic field in a direction parallel to the reference plane and orthogonal to the first direction and a third detection value corresponding to a component of the external magnetic field in the direction perpendicular to the reference plane based on the at least one second detection signal and the at least one third detection signal.

A magnetic sensor system according to the technology includes the magnetic sensor device according to the technology, and a magnetic field generator that generates a predetermined magnetic field. The relative position of the magnetic field generator with respect to the magnetic sensor device is changeable along a predetermined spherical surface.

In the magnetic sensor device and the magnetic sensor system according to the technology, the first chip includes the first magnetic sensor, and the second chip includes the second and third magnetic sensors. The first chip and the second chip are mounted on the reference plane of the support. Therefore, according to the technology, it is possible to reduce the influence of an applied stress, while preventing a cost increase.

The other objects, features, and advantages of the technology will be fully apparent with the following description. In the following, some example embodiments and modification examples of the technology are described in detail with reference to the accompanying drawings. Note that the following description is directed to illustrative examples of the disclosure and not to be construed as limiting the technology. Factors including, without limitation, numerical values, shapes, materials, components, positions of the components, and how the components are coupled to each other are illustrative only and not to be construed as limiting the technology. Further, elements in the following example embodiments which are not recited in a most-generic independent claim of the disclosure are optional and may be provided on an as-needed basis. The drawings are schematic and are not intended to be drawn to scale. Like elements are denoted with the same reference numerals to avoid redundant descriptions.

BRIEF DESCRIPTION OF THE DRAWINGS

The accompanying drawings are included to provide a further understanding of the disclosure and are incorporated in and constitute a part of this specification. The drawings illustrate example embodiments and, together with the specification, serve to explain the principles of the technology.

DETAILED DESCRIPTION

Figure 1:
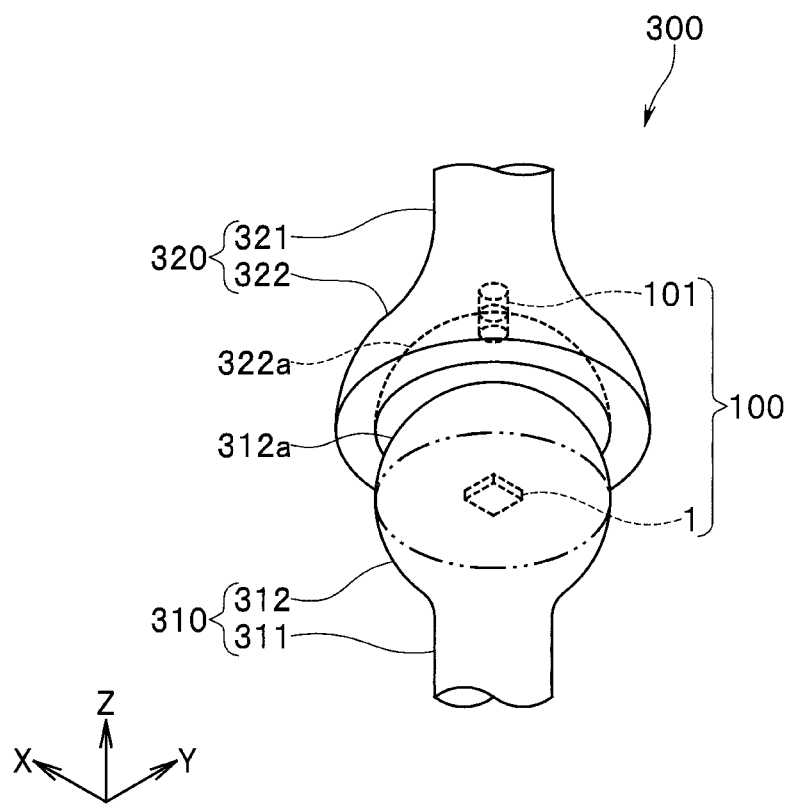
FIG. 1 is a perspective view showing the schematic configuration of a joint mechanism including a magnetic sensor system according to an embodiment of the technology.
Figure 2:
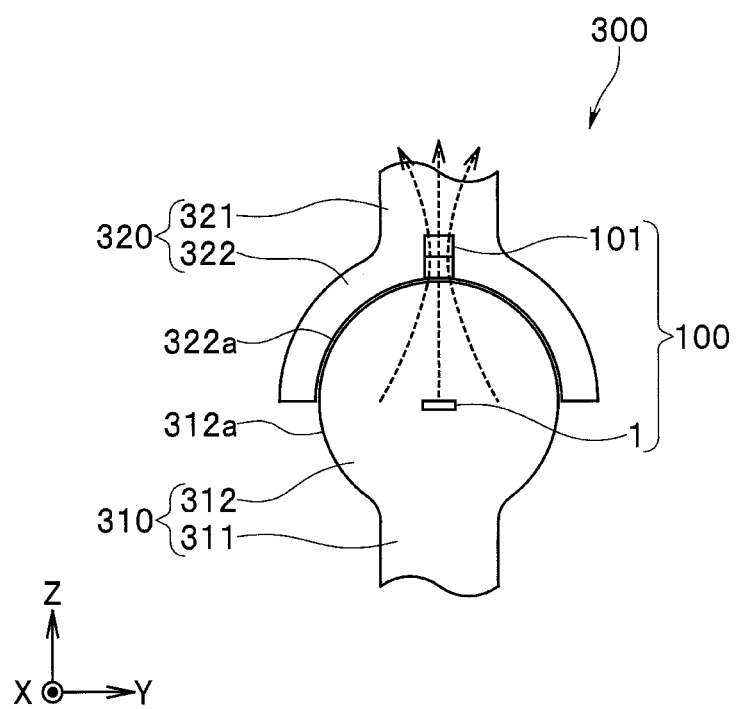
FIG. 2 is a cross-sectional view showing the schematic configuration of the joint mechanism shown in FIG. 1.
Figure 3:
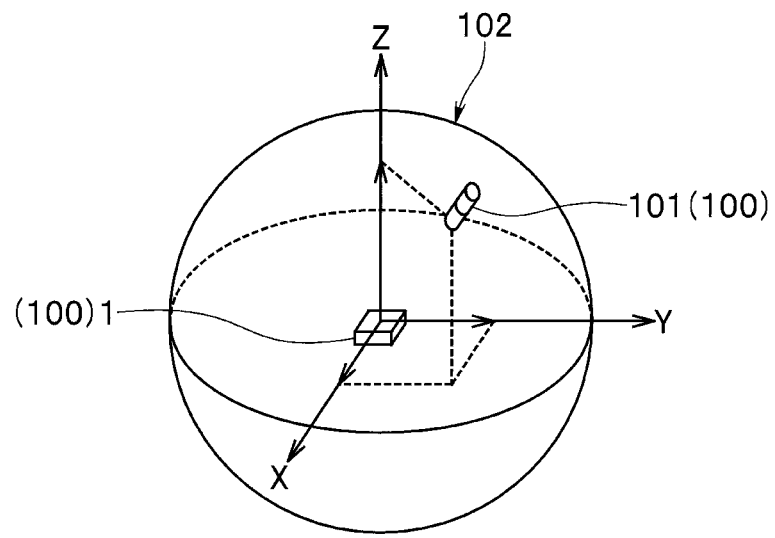
FIG. 3 is an explanatory view for describing a reference coordinate system in the magnetic sensor system according to the embodiment of the technology.

An embodiment of the technology will be described below in detail with reference to the drawings. Note that the following description is directed to illustrative examples of the disclosure and not to be construed as limiting the technology. Factors including, without limitation, numerical values, shapes, materials, components, positions of the components, and how the components are coupled to each other are illustrative only and not to be construed as limiting the technology. Further, elements in the following example embodiments which are not recited in a most-generic independent claim of the disclosure are optional and may be provided on an as-needed basis. The drawings are schematic and are not intended to be drawn to scale. Like elements are denoted with the same reference numerals to avoid redundant descriptions. First, a joint mechanism 300 to which a magnetic sensor system 100 according to the embodiment of the technology is applied will be described. The joint mechanism 300 is a mechanism including a joint. FIG. 1 is a perspective view showing a schematic configuration of the joint mechanism 300. FIG. 2 is a cross-sectional view showing the schematic configuration of the joint mechanism 300. FIG. 3 is an explanatory view for describing a reference coordinate system in the magnetic sensor system 100.

As shown in FIGS. 1 and 2, the joint mechanism 300 includes a first member 310, a second member 320, and the magnetic sensor system 100.

The first member 310 includes a shaft portion 311 and a spherical portion 312 coupled to one longitudinal end of the shaft portion 311. The spherical portion 312 includes a convex surface 312a. Here, a first spherical surface being a virtual spherical surface including the convex surface 312a is assumed. It can be said that the convex surface 312a is constituted of a part of the first spherical surface. A portion of the first spherical surface that is not included in the convex surface 312a is a border portion between the shaft portion 311 and the spherical portion 312.

The second member 320 includes a shaft portion 321 and a receptor portion 322 coupled to one longitudinal end of the shaft portion 321. The receptor portion 322 includes a concave surface 322a. Here, a second spherical surface being a virtual spherical surface including the concave surface 322a is assumed. It can be said that the concave surface 322a is constituted of a part of the second spherical surface. The concave surface 322a may be constituted of one half or almost one half of the second spherical surface.

With the spherical portion 312 fitted into the receptor portion 322, the first member 310 and the second member 320 are coupled to each other such that their positional relationship is changeable. The second spherical surface has a radius slightly greater than or equal to that of the first spherical surface. The convex surface 312a and the concave surface 322a may be in contact with each other, or opposed to each other with a lubricant therebetween. The center of the second spherical surface coincides or almost coincides with that of the first spherical surface. The coupling portion between the first and second members 310 and 320 is the joint. In the present example embodiment, the joint is a ball-and-socket joint.

The magnetic sensor system 100 includes a magnetic sensor device 1 and a magnetic field generator 101. The magnetic field generator 101 is able to change its relative position with respect to the magnetic sensor device 1 along a predetermined spherical surface. The magnetic sensor system 100 is a device for detecting the relative position of the magnetic field generator 101 with respect to the magnetic sensor device 1.

The magnetic field generator 101 generates a predetermined magnetic field. An example of the magnetic field generator 101 is a magnet. The magnetic sensor device 1 generates a first detection value, a second detection value and a third detection value that have correspondences with components in three mutually different directions of a magnetic field at a reference position. The reference position will be described in detail later.

As shown in FIGS. 1 and 2, the magnetic field generator 101 is embedded in the receptor portion 322 so as not to protrude from the concave surface 322a. The magnetic sensor device 1 is located inside the spherical portion 312. Hereinafter, the position of the center of the first spherical surface will be referred to as a reference position. The magnetic sensor device 1 is configured to detect a magnetic field at the reference position.

Hereinafter, a magnetic field that is a portion of the magnetic field generated by the magnetic field generator 101 and that is at the reference position will be referred to as a target magnetic field. For example, the direction of the target magnetic field is parallel to a virtual straight line passing through the reference position and the magnetic field generator 101. In the example shown in FIG. 2, the magnetic field generator 101 is a magnet having an N pole and an S pole arranged along the foregoing virtual straight line. The S pole is located closer to the reference position than the N pole is. The plurality of arrowed broken lines in FIG. 2 represent magnetic lines of force corresponding to the magnetic field generated by the magnetic field generator 101

The joint mechanism 300 shown in FIGS. 1 and 2 is able to change the relative position of the second member 320 with respect to the first member 310, with the spherical portion 312 fitted into the receptor portion 322. This allows the magnetic field generator 101 to be able to change its relative position with respect to the magnetic sensor device 1 along the foregoing predetermined spherical surface. In the present example embodiment, the relative position of the magnetic field generator 101 with respect to the magnetic sensor device 1 is represented by the position of a point closest to the reference position on the magnetic field generator 101. The center of the predetermined spherical surface coincides or almost coincides with the center of the first spherical surface. The predetermined spherical surface has a radius greater than or equal to that of the first spherical surface. The radius of the predetermined spherical surface may coincide with that of the first spherical surface or that of the second spherical surface.

Now, a description will be given of a reference coordinate system in the present example embodiment with reference to FIG. 3. The reference coordinate system is an orthogonal coordinate system that is set with reference to the magnetic sensor device 1 and defined by three axes for expressing the values of the first to third detection signals. An X direction, a Y direction, and a Z direction are defined in the reference coordinate system. As shown in FIG. 3, the X, Y, and Z directions are orthogonal to each other. The opposite directions to the X, Y, and Z directions will be expressed as −X, −Y, and −Z directions, respectively.

As described above, the magnetic sensor device 1 generates the first, second, and third detection values having correspondences with the components in three mutually different directions of the magnetic field at the reference position. In the present example embodiment, specifically, the three mutually different directions are a direction parallel to the X direction, a direction parallel to the Y direction, and a direction parallel to the Z direction. The three axes defining the reference coordinate system are an axis parallel to the X direction, an axis parallel to the Y direction, and an axis parallel to the Z direction.

The position of the magnetic sensor device 1 in the reference coordinate system remains unchanged. As the relative position of the magnetic field generator 101 with respect to the magnetic sensor device 1 changes, the position of the magnetic field generator 101 in the reference coordinate system changes along the foregoing predetermined spherical surface. In FIG. 3, the reference numeral 102 designates the predetermined spherical surface. The position of the magnetic field generator 101 in the reference coordinate system indicates the relative position of the magnetic field generator 101 with respect to the magnetic sensor device 1. Hereinafter, the position of the magnetic field generator 101 in the reference coordinate system will be simply referred to as the position of the magnetic field generator 101.

In the joint mechanism 300 including the magnetic sensor system 100, the magnetic sensor system 100 detects the relative position of the magnetic field generator 101 with respect to the magnetic sensor device 1, thereby enabling detection of the relative position of the second member 320 with respect to the first member 310. The joint mechanism 300 may be used for robots, industrial equipment, medical equipment, amusement equipment, etc.

The magnetic sensor system 100 is applicable not only to the joint mechanism 300 but also to joysticks and trackballs.

A joystick includes, for example, a lever and a supporter that swingably supports the lever. In the case of applying the magnetic sensor system 100 to the joystick, for example, the magnetic field generator 101 is provided inside the supporter and the magnetic sensor device 1 is provided inside the lever so that the relative position of the magnetic field generator 101 with respect to the magnetic sensor device 1 changes along a predetermined spherical surface as the lever swings.

A trackball includes, for example, a ball and a supporter that rotatably supports the ball. In the case of applying the magnetic sensor system 100 to the trackball, for example, the magnetic field generator 101 is provided inside the supporter and the magnetic sensor device 1 is provided inside the ball so that the relative position of the magnetic field generator 101 with respect to the magnetic sensor device 1 changes along a predetermined spherical surface as the ball rotates.

Figure 4:
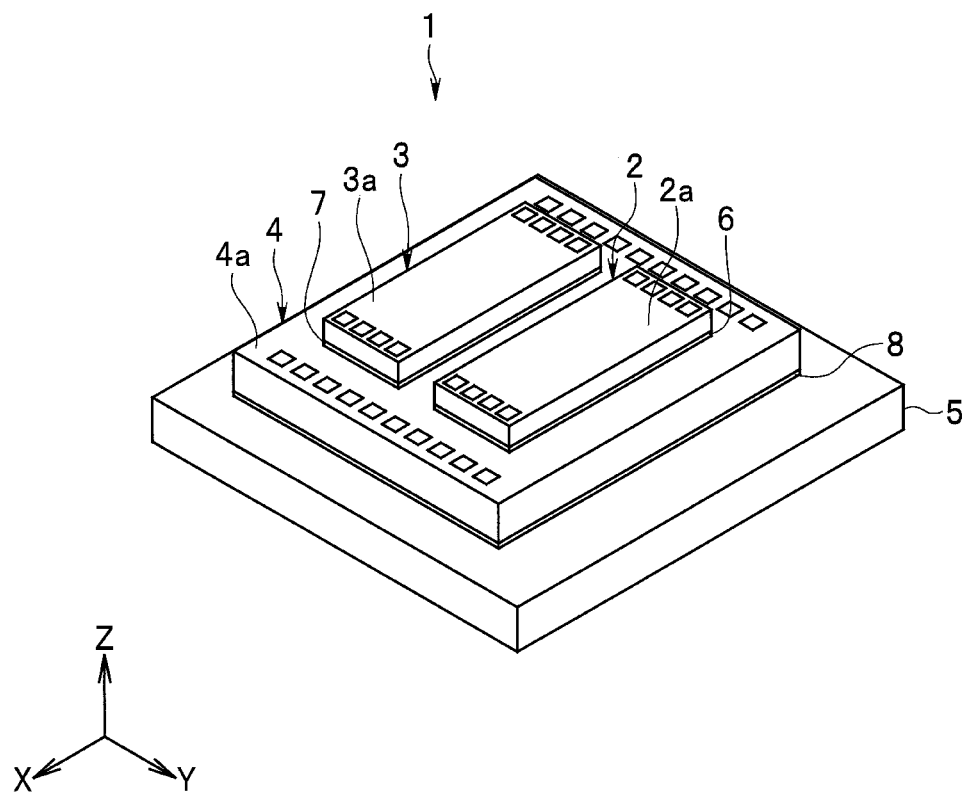
FIG. 4 is a perspective view showing a magnetic sensor device according to the embodiment of the technology.
Figure 5:
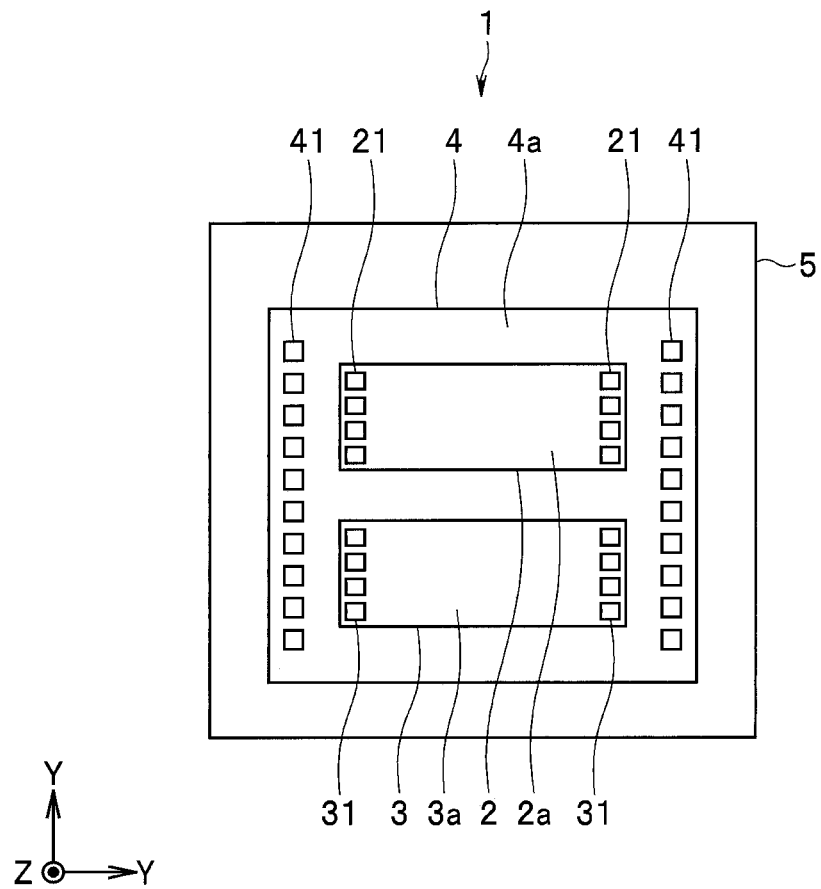
FIG. 5 is a plan view showing the magnetic sensor device of the embodiment of the technology.
Figure 6:
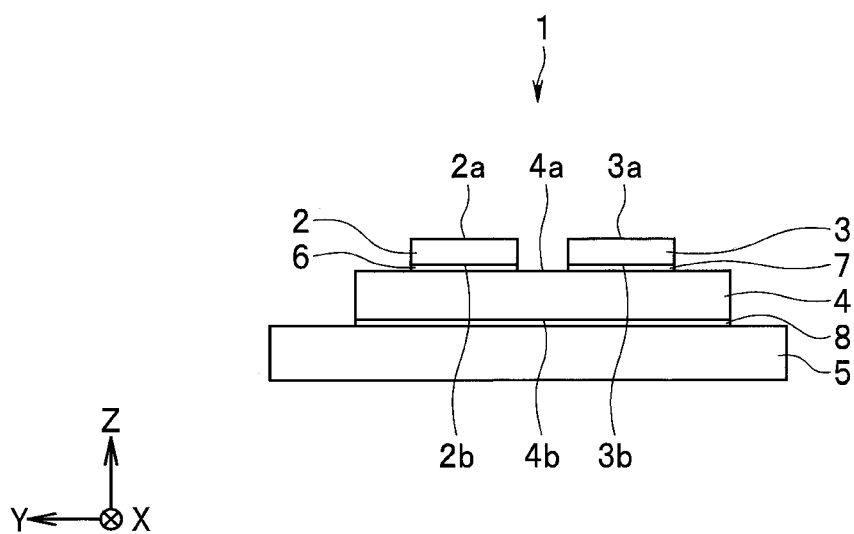
FIG. 6 is a side view showing the magnetic sensor device of the embodiment of the technology.
Figure 7:
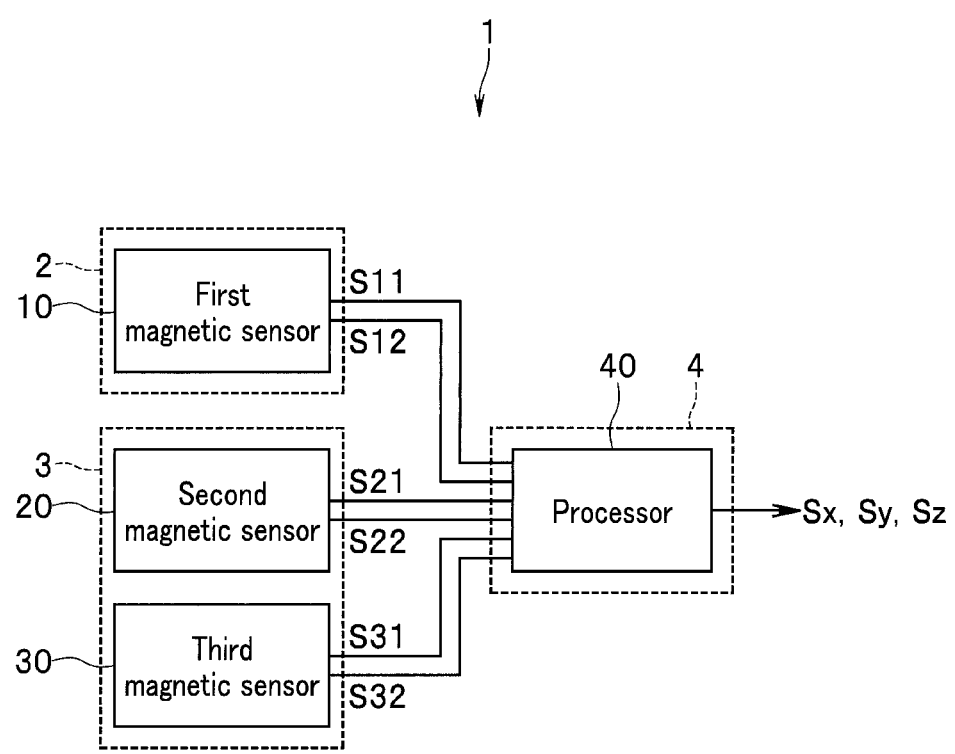
FIG. 7 is a functional block diagram showing a configuration of the magnetic sensor device according to the embodiment of the technology.

Next, the configuration of the magnetic sensor device 1 will be described with reference to FIGS. 4 to 7. FIG. 4 is a perspective view showing the magnetic sensor device 1. FIG. 5 is a plan view showing the magnetic sensor device 1. FIG. 6 is a side view showing the magnetic sensor device 1. FIG. 7 is a functional block diagram showing the configuration of the magnetic sensor device 1.

The magnetic sensor device 1 includes a first chip 2 including a first magnetic sensor 10, a second chip 3 including a second magnetic sensor 20 and a third magnetic sensor 30, and a support 4. Each of the first chip 2, the second chip 3, and the support 4 has a rectangular parallelepiped shape. The support 4 has a reference plane 4a being a top surface, a bottom surface 4b positioned opposite from the reference plane 4a, and four side surfaces connecting between the reference plane 4a and the bottom surface 4b.

Now, a relationship of the components of the magnetic sensor device 1 with the reference coordinate system will be described with reference to FIGS. 4 to 6. As described above, the X, Y, Z, −X, −Y, and −Z directions are defined in the reference coordinate system. The X and Y directions are parallel to the reference plane 4a of the support 4. The Z direction is perpendicular to the reference plane 4a of the support 4, and directed from the bottom surface 4b to the reference plane 4a of the support 4. Hereinafter, the term "above" refers to positions located forward of a reference position in the Z direction, and "below" refers to positions opposite from the "above" positions with respect to the reference position. For each component of the magnetic sensor device 1, the term "top surface" refers to a surface of the component lying at the end thereof in the Z direction, and "bottom surface" refers to a surface of the component lying at the end thereof in the −Z direction.

The first chip 2 has a top surface 2a and a bottom surface 2b positioned opposite to each other, and four side surfaces connecting between the top surface 2a and the bottom surface 2b. The second chip 3 has a top surface 3a and a bottom surface 3b positioned opposite to each other, and four side surfaces connecting between the top surface 3a and the bottom surface 3b.

The first chip 2 is mounted on the reference plane 4a in a posture such that the bottom surface 2b faces the reference plane 4a of the support 4. The second chip 3 is mounted on the reference plane 4a in a posture such that the bottom surface 3b faces the reference plane 4a of the support 4. The first chip 2 and the second chip 3 are bonded to the support 4 with, for example, adhesives 6 and 7, respectively.

In the present example embodiment, the magnetic sensor device 1 is mounted on a printed board 5. To be more specific, the magnetic sensor device 1 is mounted on a top surface of the printed board 5 in a posture such that the bottom surface 4b of the support 4 faces the top surface of the printed board 5. The support 4 is bonded to the printed board 5 with, for example, an adhesive 8. The magnetic sensor device 1 mounted on the printed board 5 is sealed with a not-shown molded resin.

The first chip 2 has a plurality of first pads (electrode pads) 21 disposed on the top surface 2a. The second chip 3 has a plurality of second pads (electrode pads) 31 disposed on the top surface 3a. The support 4 has a plurality of third pads (electrode pads) 41 disposed on the reference plane 4a. Although not shown, in the magnetic sensor device 1, among the plurality of first pads 21, the plurality of second pads 31, and the plurality of third pads 41, corresponding pairs are connected with bonding wires.

The support 4 includes a processor 40 configured to process a plurality of detection signals generated by the first to third magnetic sensors 10, 20, and 30. For example, the processor 40 is constructed of an application-specific integrated circuit (ASIC). The first to third magnetic sensors 10, 20, and 30 are connected to the processor 40 through pads 21, 31, and 41 and the plurality of bonding wires.

A dimension in a direction perpendicular to the reference plane 4a is referred to as thickness. As shown in FIG. 6, the thickness of the first chip 2 and the thickness of the second chip 3 are the same. The thickness of the support 4 is greater than the thickness of the first chip 2 and the thickness of the second chip 3.

Figure 8:
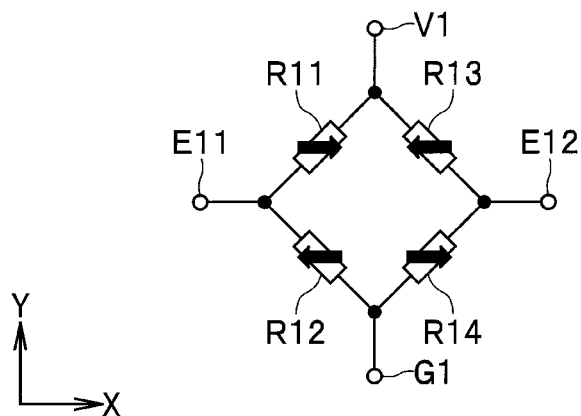
FIG. 8 is a circuit diagram showing an example of a circuit configuration of a first magnetic sensor of the embodiment of the technology.
Figure 9:
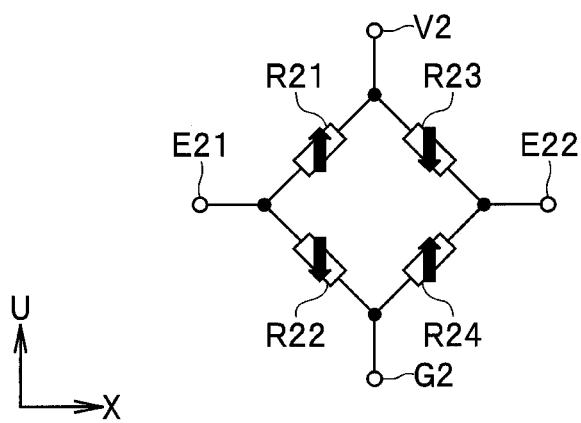
FIG. 9 is a circuit diagram showing an example of a circuit configuration of a second magnetic sensor of the embodiment of the technology.
Figure 10:
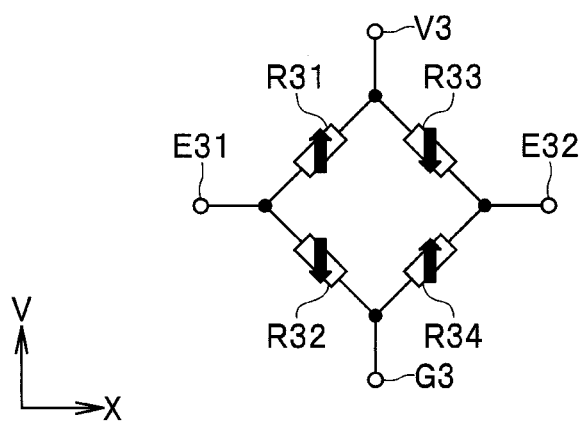
FIG. 10 is a circuit diagram showing an example of a circuit configuration of a third magnetic sensor of the embodiment of the technology.
Figure 11:
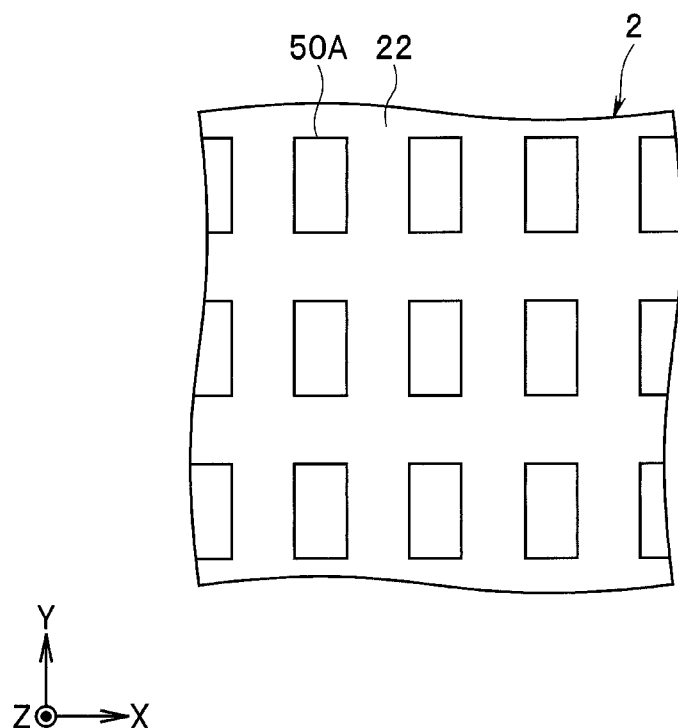
FIG. 11 is a plan view showing a part of a first chip of the embodiment of the technology.
Figure 12:
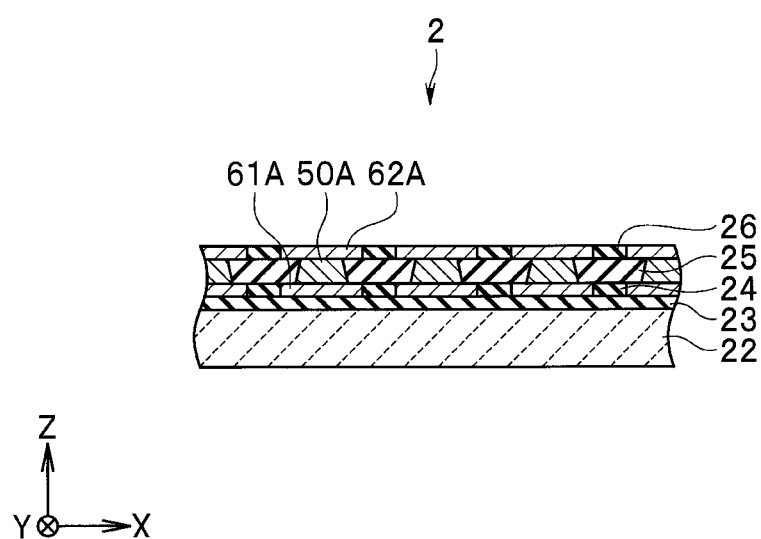
FIG. 12 is a sectional view showing a part of the first chip of the embodiment of the technology.
Figure 13:
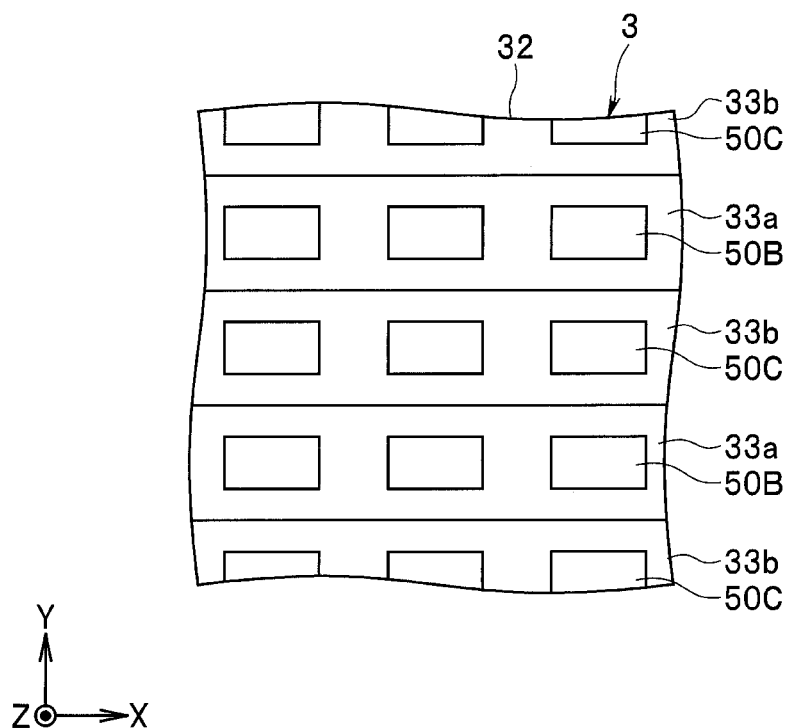
FIG. 13 is a plan view showing a part of a second chip of the embodiment of the technology.
Figure 14:
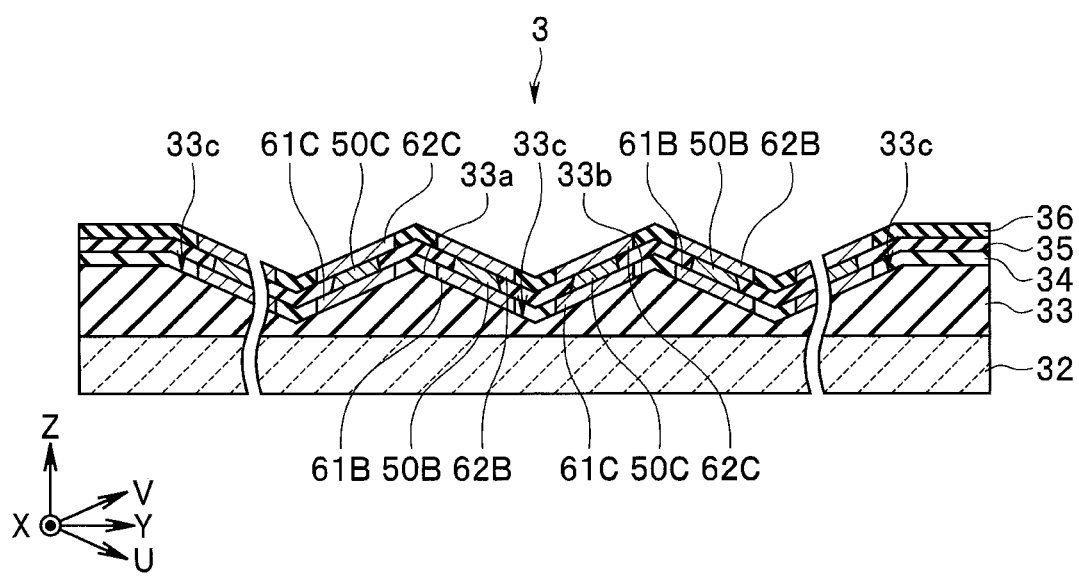
FIG. 14 is a sectional view showing a part of the second chip of the embodiment of the technology.

Next, referring to FIGS. 8 to 14, an example of the configuration of the first to third magnetic sensors 10, 20, and 30 will be described. FIG. 8 is a circuit diagram showing an example of the circuit configuration of the first magnetic sensor 10. FIG. 9 is a circuit diagram showing an example of the circuit configuration of the second magnetic sensor 20. FIG. 10 is a circuit diagram showing the circuit configuration of the third magnetic sensor 30. FIG. 11 is a plan view showing a part of the first chip 2. FIG. 12 is a sectional view showing a part of the first chip 2. FIG. 13 is a plan view showing a part of the second chip 3. FIG. 14 is a sectional view showing a part of the second chip 3.

Here, a first direction, a second direction, and a third direction are defined as follows. The first direction is a direction parallel to the reference plane 4a. The second direction is a direction inclined with respect to each of the reference plane 4a and a direction (Z direction) perpendicular to the reference plane 4a. The third direction is another direction inclined with respect to each of the reference plane 4a and the direction (Z direction) perpendicular to the reference plane 4a. More specifically, in the present example embodiment, the first direction is a direction parallel to the X direction. The second direction is orthogonal to the first direction. The third direction is orthogonal to the first direction too.

As shown in FIG. 14, a U direction and a V direction are defined as follows. The U direction is a direction rotated from the Y direction to the −Z direction. The V direction is a direction rotated from the Y direction to the Z direction. More specifically, in the present example embodiment, the U direction is set to a direction rotated from the Y direction to the −Z direction by α, and the V direction is set to a direction rotated from the Y direction to the Z direction by α. Note that a is an angle greater than 0° and smaller than 90°. −U direction refers to a direction opposite to the U direction, and −V direction refers to a direction opposite to the V direction.

The second direction is a direction parallel to the U direction. The third direction is a direction parallel to the V direction.

The first magnetic sensor 10 includes at least one first magnetic detection element, and detects a first component of an external magnetic field. The first component is a component in the first direction (direction parallel to the X direction) of the external magnetic field. The first magnetic sensor 10 generates at least one first detection signal having a correspondence with the first component. The external magnetic field contains the aforementioned target magnetic field.

The second magnetic sensor 20 includes at least one second magnetic detection element, and detects a second component of an external magnetic field. The second component is a component in the second direction (direction parallel to the U direction) of the external magnetic field. The second magnetic sensor 20 generates at least one second detection signal having a correspondence with the second component.

The third magnetic sensor 30 includes at least one third magnetic detection element, and detects a third component of an external magnetic field. The third component is a component in the third direction (direction parallel to the V direction) of the external magnetic field. The third magnetic sensor 30 generates at least one third detection signal having a correspondence with the third component.

In the example shown in FIG. 8, the first magnetic sensor 10 includes a power port V1, a ground port G1, signal output ports E11 and E12, and four resistor sections R11, R12, R13, and R14. The resistor section R11 is disposed between the power port V1 and the signal output port E11. The resistor section R12 is disposed between the signal output port E11 and the ground port G1. The resistor section R13 is disposed between the power port V1 and the signal output port E12. The resistor section R14 is disposed between the signal output port E12 and the ground port G1. Each of the resistor sections R11, R12, R13, and R14 includes at least one first magnetic detection element.

In the example shown in FIG. 9, the second magnetic sensor 20 includes a power port V2, a ground port G2, signal output ports E21 and E22, and four resistor sections R21, R22, R23, and R24. The resistor section R21 is disposed between the power port V2 and the signal output port E21. The resistor section R22 is disposed between the signal output port E21 and the ground port G2. The resistor section R23 is disposed between the power port V2 and the signal output port E22. The resistor section R24 is disposed between the signal output port E22 and the ground port G2. Each of the resistor sections R21, R22, R23, and R24 includes at least one second magnetic detection element.

In the example shown in FIG. 10, the third magnetic sensor 30 includes a power port V3, a ground port G3, signal output ports E31 and E32, and four resistor sections R31, R32, R33, and R34. The resistor section R31 is disposed between the power port V3 and the signal output port E31. The resistor section R32 is disposed between the signal output port E31 and the ground port G3. The resistor section R33 is disposed between the power port V3 and the signal output port E32. The resistor section R34 is disposed between the signal output port E32 and the ground port G3. Each of the resistor sections R31, R32, R33, and R34 includes at least one third magnetic detection element.

In the present example embodiment, the magnetic detection elements included in the first to third magnetic sensors 10, 20, and 30 are magnetoresistive elements. The magnetoresistive element is hereinafter abbreviated as MR element. The first magnetic sensor 10 includes a plurality of first MR elements 50A, as the at least one first magnetic detection element. The second magnetic sensor 20 includes a plurality of second MR elements 50B, as the at least one second magnetic detection element. The third magnetic sensor 30 includes a plurality of third MR elements 50C, as the at least one third magnetic detection element.

The first magnetic sensor 10 further includes a plurality of lower electrodes 61A and a plurality of upper electrodes 62A configured to electrically connect the plurality of first MR elements 50A. The second magnetic sensor 20 further includes a plurality of lower electrodes 61B and a plurality of upper electrodes 62B configured to electrically connect the plurality of second MR elements 50B. The third magnetic sensor 30 further includes a plurality of lower electrodes 61C and a plurality of upper electrodes 62C configured to electrically connect the plurality of third MR elements 50C.

As shown in FIG. 12, the first chip 2 includes a substrate 22 and insulating layers 23, 24, 25, and 26. The insulating layer 23 is disposed on the substrate 22. The plurality of lower electrodes 61A are disposed on the insulating layer 23. The insulating layer 24 is disposed around the plurality of lower electrodes 61A on the insulating layer 23. The plurality of first MR elements 50A are disposed on the plurality of lower electrodes 61A. The insulating layer 25 is disposed around the plurality of first MR elements 50A on the plurality of lower electrodes 61A and the insulating layer 24. The plurality of upper electrodes 62A are disposed on the plurality of first MR elements 50A and the insulating layer 25. The insulating layer 26 is disposed around the plurality of upper electrodes 62A on the insulating layer 25. Note that FIG. 11 omits the plurality of lower electrodes 61A, the plurality of upper electrodes 62A, and the insulating layers 23 to 26.

In the state of mounting the first chip 2 on the reference plane 4a of the support 4 (refer to FIGS. 4 to 6), a top surface of the substrate 22 is in parallel with the reference plane 4a. The insulating layer 23 and the plurality of lower electrodes 61A are stacked on the top surface of the substrate 22. In the foregoing state, a top surface of each of the plurality of lower electrodes 61A is also in parallel with the reference plane 4a. Thus, it can be said that, in the foregoing state, the plurality of first MR elements 50A are disposed on a flat surface parallel to the reference plane 4a.

As shown in FIG. 14, the second chip 3 includes a substrate 32 and insulating layers 33, 34, 35, and 36. The insulating layer 33 is disposed on the substrate 32. The plurality of lower electrodes 61B and the plurality of lower electrodes 61C are disposed on the insulating layer 33. The insulating layer 34 is disposed around the plurality of lower electrodes 61B and the plurality of lower electrodes 61C on the insulating layer 33. The plurality of second MR elements 50B are disposed on the plurality of lower electrodes 61B. The plurality of third MR elements 50C are disposed on the plurality of lower electrodes 61C. The insulating layer 35 is disposed around the plurality of second MR elements 50B and the plurality of third MR elements 50C on the plurality of lower electrodes 61B, the plurality of lower electrodes 61C, and the insulating layer 34. The plurality of upper electrodes 62B are disposed on the plurality of second MR elements 50B and the insulating layer 35. The plurality of upper electrodes 62C are disposed on the plurality of third MR elements 50C and the insulating layer 35. The insulating layer 36 is disposed around the plurality of upper electrodes 62B and the plurality of upper electrodes 62C on the insulating layer 35.

In the state of mounting the second chip 3 on the reference plane 4a of the support 4 (refer to FIGS. 4 to 6), a top surface of the substrate 32 is in parallel with the reference plane 4a. The insulating layer 33 has a plurality of groove sections 33c. Each of the plurality of groove sections 33c has an inclined surface 33a and an inclined surface 33b that are inclined with respect to the top surface of the substrate 32. The plurality of lower electrodes 61B are disposed on each of the inclined surfaces 33a of the plurality of groove sections 33c. The plurality of lower electrodes 61C are disposed on each of the inclined surfaces 33b of the plurality of the groove sections 33c. In the foregoing state, a top surface of each of the plurality of lower electrodes 61B and a top surface of each of the plurality of lower electrodes 61C are also inclined with respect to the reference plane 4a. Thus, it can be said that, in the foregoing state, the plurality of second MR elements 50B and the plurality of third MR elements 50C are disposed on inclined surfaces that are inclined with respect to the reference plane 4a.

In the state of mounting the second chip 3 on the reference plane 4a of the support 4 (refer to FIGS. 4 to 6), the inclined surfaces 33a are in parallel with an XU plane, and the inclined surfaces 33b are in parallel with an XV plane. Thus, it can be said that, in the foregoing state, the plurality of second MR elements 50B are disposed on inclined surfaces parallel to the XU plane, and the plurality of third MR elements 50C are disposed on inclined surfaces parallel to the XV plane.

Figure 15:
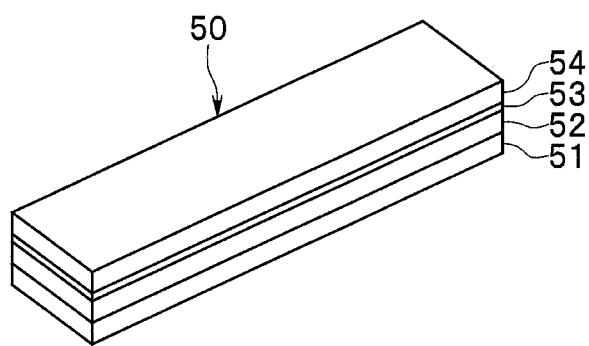
FIG. 15 is a perspective view showing a magnetoresistive element of the embodiment of the technology.

An optional MR element is indicated with a reference numeral 50 below. An optional lower electrode is indicated with a reference numeral 61. An optional upper electrode is indicated with a reference numeral 62. FIG. 15 is a perspective view showing an MR element 50. In the present example embodiment, the MR element 50 is specifically a spin-valve MR element. The MR element 50 includes a magnetization pinned layer 52 having a magnetization in a fixed direction, a free layer 54 having a magnetization whose direction is variable depending on the direction of an external magnetic field, and a gap layer 53 located between the magnetization pinned layer 52 and the free layer 54. The MR element 50 may be a tunneling magnetoresistive (TMR) element or a giant magnetoresistive (GMR) element. In the TMR element, the gap layer 53 is a tunnel barrier layer. In the GMR element, the gap layer 53 is a nonmagnetic conductive layer. The resistance of the MR element 50 changes with the angle that the magnetization direction of the free layer 54 forms with respect to the magnetization direction of the magnetization pinned layer 52. The resistance of the MR element 50 is at its minimum value when the foregoing angle is 0°, and at its maximum value when the foregoing angle is 180°. In each MR element 50, the free layer 54 has a shape anisotropy that sets the direction of the magnetization easy axis to be orthogonal to the magnetization direction of the magnetization pinned layer 52. As a method for setting the magnetization easy axis in a predetermined direction in the free layer 54, a magnet configured to apply a bias magnetic field to the free layer 54 can be used.

The MR element 50 further includes an antiferromagnetic layer 51. The antiferromagnetic layer 51, the magnetization pinned layer 52, the gap layer 53, and the free layer 54 are stacked in this order from the side of a lower electrode 61. The antiferromagnetic layer 51 is electrically connected to the lower electrode 61. The antiferromagnetic layer 51 is formed of an antiferromagnetic material, and is in exchange coupling with the magnetization pinned layer 52 to thereby pin the magnetization direction of the magnetization pinned layer 52. The magnetization pinned layer 52 may be a so-called self-pinned layer (Synthetic Ferri Pinned layer, SFP layer). The self-pinned layer has a stacked ferri structure in which a ferromagnetic layer, a nonmagnetic intermediate layer, and a ferromagnetic layer are stacked, and the two ferromagnetic layers are antiferromagnetically coupled. In a case where the magnetization pinned layer 52 is the self-pinned layer, the antiferromagnetic layer 51 may be omitted.

Each upper electrode 62 is long and thin in shape, and is disposed on two lower electrodes 61 adjacent in a longitudinal direction of the lower electrode 61 to electrically connect adjacent two MR elements 50. It should be appreciated that the layers 51 to 54 of each MR element 50 may be stacked in the reverse order to that shown in FIG. 15.

In FIGS. 8 to 10, solid arrows represent the magnetization directions of the magnetization pinned layers 52 of the MR elements 50. In the example shown in FIG. 8, the magnetization direction of the magnetization pinned layer 52 of the first MR element 50A in each of the resistor sections R11 and R14 is the X direction. The magnetization direction of the magnetization pinned layer 52 of the first MR element 50A in each of the resistor sections R12 and R13 is the −X direction. As shown in FIG. 11, the free layer 54 of the first MR element 50A has a shape anisotropy that sets the direction of the magnetization easy axis to be in parallel with the Y direction.

In the example shown in FIG. 9, the magnetization direction of the magnetization pinned layer 52 of the second MR element 50B in each of the resistor sections R21 and R24 is the U direction. The magnetization direction of the magnetization pinned layer 52 of the second MR element 50B in each of the resistor sections R22 and R23 is the −U direction. As shown in FIG. 13, the free layer 54 of the second MR element 50B has a shape anisotropy that sets the direction of the magnetization easy axis to be in parallel with the X direction.

In the example shown in FIG. 10, the magnetization direction of the magnetization pinned layer 52 of the third MR element 50C in each of the resistor sections R31 and R34 is the V direction. The magnetization direction of the magnetization pinned layer 52 of the third MR element 50C in each of the resistor sections R32 and R33 is the −V direction. As shown in FIG. 13, the free layer 54 of the third MR element 50C has a shape anisotropy that sets the direction of the magnetization easy axis to be in parallel with the X direction.

When the strength of a component of the external magnetic field in the first direction (direction in parallel with the X direction) i.e. the strength of the first component changes, the resistance of each of the resistor sections R11 to R14 changes such that the resistances of the resistor sections R12 and R13 decrease with an increase in the resistances of the resistor sections R11 and R14, or the resistances of the resistor sections R12 and R13 increase with a decrease in the resistances of the resistor sections R11 and R14. Thereby the electric potential of each of the signal output ports E11 and E12 changes. The first magnetic sensor 10 generates a signal corresponding to the electric potential of the signal output port E11 as a first detection signal S11, and generates a signal corresponding to the electric potential of the signal output port E12 as a first detection signal S12.

When the strength of a component of the external magnetic field in the second direction (direction in parallel with the U direction) i.e. the strength of the second component changes, the resistance of each of the resistor sections R21 to R24 changes such that the resistances of the resistor sections R22 and R23 decrease with an increase in the resistances of the resistor sections R21 and R24, or the resistances of the resistor sections R22 and R23 increase with a decrease in the resistances of the resistor sections R21 and R24. Thereby the electric potential of each of the signal output ports E21 and E22 changes. The second magnetic sensor 20 generates a signal corresponding to the electric potential of the signal output port E21 as a second detection signal S21, and generates a signal corresponding to the electric potential of the signal output port E22 as a second detection signal S22.

When the strength of a component of the external magnetic field in the third direction (direction in parallel with the V direction) i.e. the strength of the third component changes, the resistance of each of the resistor sections R31 to R34 changes such that the resistances of the resistor sections R32 and R33 decrease with an increase in the resistances of the resistor sections R31 and R34, or the resistances of the resistor sections R32 and R33 increase with a decrease in the resistances of the resistor sections R31 and R34. Thereby the electric potential of each of the signal output ports E31 and E32 changes. The third magnetic sensor 30 generates a signal corresponding to the electric potential of the signal output port E31 as a third detection signal S31, and generates a signal corresponding to the electric potential of the signal output port E32 as a third detection signal S32.

Next, the operation of the processor 40 will be described. The processor 40 generates a first detection value Sx corresponding to the first component (component in a direction parallel to the X direction) of the external magnetic field based on the first detection signals S11 and S12. In the present example embodiment, the processor 40 generates the first detection value Sx by an arithmetic including obtainment of the difference S11−S12 between the first detection signal S11 and the first detection signal S12. The first detection value Sx may be the difference S11−S12 itself, or may be a result of a predetermined correction, such as a gain adjustment or an offset adjustment, made to the difference S11−S12.

The processor 40 generates a second detection value and a third detection value based on the second detection signals S21 and S22 and the third detection signals S31 and S32. The second detection value is a detection value corresponding to a component of the external magnetic field in a direction that is parallel to the reference plane 4a and orthogonal to the first direction (direction parallel to the X direction). In the present example embodiment, as the second detection value, the processor 40 generates a detection value corresponding to the component of the external magnetic field in a direction parallel to the Y direction. The third detection value is a detection value corresponding to a component of the external magnetic field in a direction perpendicular to the reference plane 4a i.e. a component in a direction parallel to the Z direction. The second detection value is represented by a symbol Sy, and the third detection value is represented by a symbol Sz.

The processor 40 generates the second and third detection values Sy and Sz as follows, for example. First, the processor 40 generates a value S2 by an arithmetic including obtainment of the difference S21−S22 between the second detection signal S21 and the second detection signal S22, and generates a value S3 by an arithmetic including obtainment of the difference S31−S32 between the third detection signal S31 and the third detection signal S32. Next, the processor 40 calculates values S3 and S4 using the following expressions (1) and (2).

$$S3=(S2+S1)/\cos \alpha \quad (1)$$

$$S4=(S2-S1)/\sin \alpha \quad (2)$$

The second detection value Sy may be the value S3 itself, or may be a result of a predetermined correction, such as a gain adjustment or an offset adjustment, made to the value S3. In the same manner, the third detection value Sz may be the value S4 in itself, or may be a result of a predetermined correction, such as a gain adjustment or an offset adjustment, made to the value S4.

Figure 16:
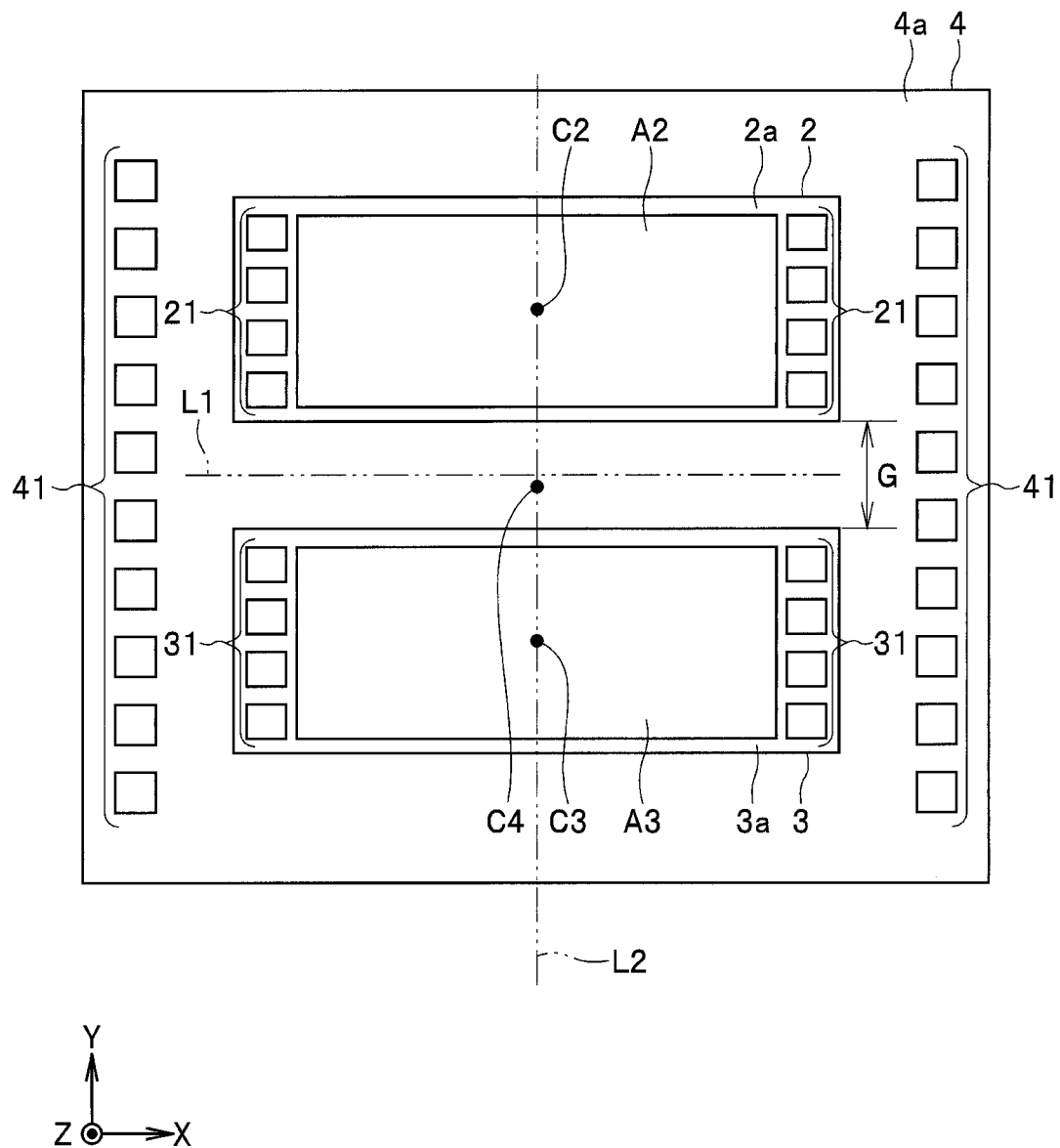
FIG. 16 is an explanatory view for describing the shape and alignment of the first and second chips of the embodiment of the technology.

Next, referring to FIG. 16, the structural features of the magnetic sensor device 1 will be described. FIG. 16 is an explanatory view for describing the shapes and alignment of the first and second chips 2 and 3. As shown in FIG. 16, the first chip 2 and the second chip 3 are aligned along the Y direction. When viewed from a direction perpendicular to the reference plane 4a i.e. the Z direction, each of the first chip 2 and the second chip 3 has a planar shape long in a direction orthogonal to the direction (direction parallel to the Y direction) of alignment of the first chip 2 and the second chip 3 i.e. in a direction parallel to the X direction. The planar shape of the first chip 2 when viewed from the Z direction may have the same size or substantially the same size as the planar shape of the second chip 3 when viewed from the Z direction, or may be smaller than the planar shape of the second chip 3. In FIG. 16, for the sake of convenience, the first chip 2 and the second chip 3 are shown such that the planar shape of the first chip 2 has the same size as the planar shape of the second chip 3. The first chip 2 and the second chip 3 are disposed with a predetermined gap G therebetween. The size of the gap G is preferably within a range of 5 to 400 µm.

In FIG. 16, a line indicated with a reference numeral L1 represents a virtual straight line that passes through the gap G and has the same distance from the first chip 2 and from the second chip 3. The virtual straight line L1 represents the center of the gap G in the direction (direction parallel to the Y direction) of alignment of the first chip 2 and the second chip 3. A point indicated with a reference numeral C4 represents the barycenter of the support 4, when the support 4 is viewed from the Z direction. The first chip 2 and the second chip 3 are aligned such that, when viewed from the Z direction, the virtual straight line L1 does not cross the barycenter C4.

In FIG. 16, a point indicated with a reference numeral C2 represents the barycenter of the first chip 2, when the first chip 2 is viewed from the Z direction. A point indicated with a reference numeral C3 represents the barycenter of the second chip 3, when the second chip 3 is viewed from the Z direction. A straight line indicated with a reference numeral L2 represents a virtual straight line passing through the barycenter C2 and the barycenter C3. The first chip 2 and the second chip 3 are disposed such that, when viewed from the Z direction, the virtual straight line L2 is in parallel with the alignment direction of the first chip 2 and the second chip 3, i.e. the Y direction.

As shown in FIG. 16, the first chip 2 includes a first element arrangement area A2 in which the plurality of first MR elements 50A are disposed. The second chip 3 includes a second element arrangement area A3 in which the plurality of second MR elements 50B and the plurality of third MR elements 50C are disposed. More specifically, in the present example embodiment, when viewed from the Z direction, the second element arrangement area A3 has a planar shape long in a direction orthogonal to a longitudinal direction of the planar shape of the second chip 3, that is, in a direction parallel to the Y direction.

The first element arrangement area A2 may be the same or substantially the same in size as the second element arrangement area A3, or may be smaller in size than the second element arrangement area A3. Note that, in FIG. 16, for the sake of convenience, the first element arrangement area A2 is shown so as to have the same size as the second element arrangement area A3. In a case where the first element arrangement area A2 is smaller in size than the second element arrangement area A3, the first element arrangement area A2 may be ½ or less of the second element arrangement area A3 in size, or may be less than ½ of the second element arrangement area A3 in size. More specifically, in the present example embodiment, the plurality of first MR elements 50A are arranged in the surface parallel to the reference plane 4a, and the plurality of second MR elements 50B and the plurality of third MR elements 50C are arranged in the inclined surfaces that are inclined with respect to the reference plane 4a. The plurality of second MR elements 50B and the plurality of third MR elements 50C are used for generating the second and third detection values Sy and Sz corresponding to components of the external magnetic field in directions across the inclined surfaces, that is, the second detection value Sy corresponding to a component of the external magnetic field in a direction parallel to the Y direction and the third detection value Sz corresponding to a component of the external magnetic field in a direction parallel to the Z direction, respectively. On the contrary, the plurality of first MR elements 50A are used for generating the first detection value Sx corresponding to a component of the external magnetic field in a direction parallel to the reference plane 4a, that is, a component of the external magnetic field in a direction parallel to the X direction. Accordingly, even if the number of the plurality of first MR elements 50A is reduced to less than ½ of the total number of the plurality of second MR elements 50B and the plurality of third MR elements 50C by reducing the first element arrangement area A2 to less than ½ of the second element arrangement area A3 in size, the ratio of change of the first detection value Sx relative to change in the strength of the component of the external magnetic field in the direction parallel to the X direction can be made the same or substantially the same as the ratio of change of the second detection value Sy relative to change in the strength of the component of the external magnetic field in the direction parallel to the Y direction and the ratio of change of the third detection value Sz relative to change in the strength of the component of the external magnetic field in the direction parallel to the Z direction.

As shown in FIG. 16, the plurality of first pads 21 of the first chip 2 are disposed in the vicinity of both ends of the first chip 2 in a longitudinal direction of the first chip 2 i.e. a direction parallel to the X direction. The plurality of second pads 31 of the second chip 3 are disposed in the vicinity of both ends of the second chip 3 in a longitudinal direction of the second chip 3 i.e. a direction parallel to the X direction. Part of the plurality of third pads 41 of the support 4 are disposed on both sides of the first chip 2 in the longitudinal direction of the first chip 2. The other part of the plurality of third pads 41 of the support 4 are disposed on both sides of the second chip 3 in the longitudinal direction of the second chip 3. Arrangement of the plurality of first pads 21, the plurality of second pads 31, and the third pads 41 as described above facilitates connection with the bonding wires.

The function and effect of the magnetic sensor device 1 according to the present example embodiment will now be described. In the present example embodiment, the first chip 2 including the first magnetic sensor 10 and the second chip 3 including the second magnetic sensor 20 and the third magnetic sensor 30 are separated. The first chip 2 and the second chip 3 are mounted on the reference plane 4a of the support 4. Therefore, according to the present example embodiment, it is possible to reduce the effect of stresses applied to the magnetic sensor device 1, and more specifically, errors of the detection signals S11, S12, S21, S22, S31, and S32 caused by the stresses.

Simulation results to investigate the stresses applied to the magnetic sensor device 1 will be described below. First, a model of a practical example and a model of a comparative example used in simulation will be described. The model of the practical example, which is a model corresponding to the magnetic sensor device 1 according to a present example embodiment, is a model of an assembly. This assembly, into which the magnetic sensor device 1 and the magnetic field generator 5 are integrated, is fixed on a board for a bending test. In the model of the practical example, the dimension of the first chip 2 in the X direction was set to 670 μm, the dimension of the first chip 2 in the Y direction was set to 320 μm, and the dimension of the first chip 2 in the Z direction was set to 100 μm. The dimension of the second chip 3 in the X direction was set to 670 μm, the dimension of the second chip 3 in the Y direction was set to 540 μm, and the dimension of the second chip 3 in the Z direction was set to 100 μm. The gap G (refer to FIG. 16) was set to 90 μm.

The dimension of the support 4 in the X direction was set to 1560 μm, the dimension of the support 4 in the Y direction was set to 1290 μm, and the dimension of the support 4 in the Z direction was set to 150 μm. The dimension of the printed board 5 in the X direction was set to 1850 μm, the dimension of the printed board 5 in the Y direction was set to 1780 μm, and the dimension of the printed board 5 in the Z direction was set to 190 μm.

The model of the comparative example, which is a model corresponding to a magnetic sensor device according to the comparative example, is a model of an assembly. This assembly, into which the magnetic sensor device according to the comparative example and the printed board 5 are integrated, is fixed on a board for a bending test. The magnetic sensor according to the comparative example includes a single chip which contains the first to third magnetic sensors 10, 20, and 30, instead of the first and second chips 2 and 3 of the present example embodiment. The single chip includes a first element arrangement area A2 in which a plurality of first MR elements 50A of the first magnetic sensor 10 are disposed, and a second element arrangement area A3 in which a plurality of second MR elements 50B of the second magnetic sensor 20 and a plurality of third MR elements 50C of the third magnetic sensor 30 are disposed. In the model of the comparative example, the dimension of the single chip in the X direction was set to 750 μm, the dimension of the single chip in the Y direction was set to 800 μm, and the dimension of the single chip in the Z direction was set to 100 μm.

Next, the simulation results will be described. In the simulation, a stress applied to both the first element arrangement area A2 and the second element arrangement area A3, in a case where the board for the bending test was bent with respect to a predetermined axis that passes through the assembly and is parallel to a predetermined direction, was calculated. In the simulation, the board for the bending test was bent in such a way that a strain amount of 1500 μST is generated in the board for the bending test. Here, a direction rotated by 45° from the X direction to the Y direction is referred to as a 45° direction. In the model of the comparative example, a stress applied to each element of the first element arrangement area A2 and the second element arrangement area A3 was calculated in each of cases where the foregoing predetermined axis was an axis in a direction parallel to the X direction, an axis in a direction parallel to the Y direction, and an axis in a direction parallel to the 45° direction. As to the model of the practical example, a stress applied to each of the first element arrangement area A2 and the second element arrangement area A3 was calculated in a case where the foregoing predetermined axis was an axis in a direction parallel to the 45° direction.

Next, the simulation results will be described. As to the model of the comparative example, in a case where the foregoing predetermined axis was the axis in the direction parallel to the X direction, the stress applied to the first element arrangement area A2 was in a range of 2.0 MPa, and the stress applied to the second element arrangement area A3 was in a range of 4.7 MPa. In a case where the foregoing predetermined axis was the axis in the direction parallel to the Y direction, the stress applied to the first element arrangement area A2 was in a range of 2.8 MPa, and the stress applied to the second element arrangement area A3 was in a range of 5.4 MPa. In a case where the foregoing predetermined axis was the axis in the direction parallel to the 45° direction, the stress applied to the first element arrangement area A2 was in a range of 9.2 MPa, and the stress applied to the second element arrangement area A3 was in a range of 10.2 MPa. As understood from these results, the range of the stress applied to each of the first and second element arrangement areas A2 and A3 becomes its maximum, in a case where the board for the bending test is bent with respect to the axis in the direction parallel to the 45° direction. Therefore, it is preferable to reduce the variations in stress applied to each of the first and second element arrangement areas A2 and A3 in this case.

In the model of the practical example, in a case where the foregoing predetermined axis was an axis in a direction parallel to the 45° direction, the stress applied to the first element arrangement area A2 was in a range of 6.7 MPa, and the stress applied to the second element arrangement area A3 was in a range of 8.3 MPa. As understood from these results, according to the present example embodiment, it is possible to reduce variations in the stress applied to each of the first and second element arrangement areas A2 and A3 and hence reduce errors of the detection signals S11, S12, S21, S22, S31, and S32 caused by the stresses, as compared to a case where the first to third magnetic sensors 10, 20, and 30 are included in the single chip.

Note that, in a case where a stress is uniformly applied to each of the first and second element arrangement areas A2 and A3, combination of the MR elements 50 having different directions of magnetization of the free layers 54 and different directions of magnetization of the magnetization pinned layers 52 allows a reduction in errors of the detection signals S11, S12, S21, S22, S31, and S32 caused by the stresses. However, in actual fact, a non-uniform stress is applied to each of the first and second element arrangement areas A2 and A3, due to various factors such as how to apply a stress, the structures of the printed board and the support, or the like. Accordingly, there are cases where the errors of the detection signals S11, S12, S21, S22, S31, and S32 caused by the stresses cannot be reduced even with the foregoing method. On the other hand, according to the present example embodiment, it is possible to reduce variations in the stress applied to each of the first and second element arrangement areas A2 and A3 and hence reduce errors of the detection signals S11, S12, S21, S22, S31, and S32 caused by the stresses.

Other effects of the present example embodiment will be described below. In the present example embodiment, the second magnetic sensor 20 and the third magnetic sensor 30 are provided on the second chip 3. Thereby, according to the present example embodiment, as compared to the case of providing the second magnetic sensor 20 and the third magnetic sensor 30 in different chips, it is possible to reduce the number of chips. Therefore, according to the present example embodiment, it is possible to reduce the influence of the stresses applied to the magnetic sensor device 1, while preventing increase in cost of the magnetic sensor device 1.

In the present example embodiment, the plurality of first MR elements 50A of the first magnetic sensor 10 are disposed on the flat surface parallel to the reference plane 4a, and the plurality of second MR elements 50B of the second magnetic sensor 20 and the plurality of third MR elements 50C of the third magnetic sensor 30 are disposed on the inclined surfaces that are inclined with respect to the reference plane 4a. In the case of providing the first to third magnetic sensors 10, 20, and 30 on a single chip, just as in the case of the magnetic sensor device according to the comparative example, the flat surface and the inclined surfaces have to be formed on a single substrate and the plurality of MR elements 50 have to be formed simultaneously on the flat surface and the inclined surfaces. In this case, it is difficult to individually adjust the characteristics of the MR elements 50 formed on the flat surface and the characteristics of the MR elements 50 formed on the inclined surfaces. This is because of difference in a deposition rate, a milling rate, and the thickness of a resist coating between the flat surface and the inclined surfaces. Due to the same reason, there is a problem of difference between a process condition to stably produce the MR elements 50 without any defect on the flat surface and a process condition to stably produce the MR elements 50 without any defect on the inclined surfaces. If the MR elements 50 to be formed on the flat surface and the MR elements 50 to be formed on the inclined surfaces are formed in separate steps, the number of steps increases.

According to the present example embodiment, the first MR elements 50A formed on the flat surface and the second and third MR elements 50B and 50C formed on the inclined surfaces are provided in different chips. Therefore, according to the present example embodiment, it is possible to form the first MR elements 50A independently of the second and third MR elements 50B and 50C, and as a result, it is possible to prevent the occurrence of the aforementioned various problems caused by forming the plurality of MR elements 50 simultaneously on the flat surface and the inclined surfaces.

In the present example embodiment, the plurality of first MR elements 50A are formed on the flat surface. Therefore, it is possible to eliminate steps of forming the inclined surfaces in manufacturing the first chip 2, thus resulting in an increase in a yield rate of the first chip 2 and a reduction in cost of the first chip 2.

In the present example embodiment, each of the first chip 2 and the second chip 3 has a planar shape long in a direction parallel to the X direction, when viewed from the Z direction. In a case where the reference plane 4a of the support 4 is square or substantially square in shape, forming each of the first chip 2 and the second chip 3 into the aforementioned planar shape makes it possible to mount the first chip 2 and the second chip 3 on the reference plane 4a without unnecessary space. Thereby, according to the present example embodiment, it is possible to reduce wasted space that is unavailable to dispose a chip or pad in the reference plane 4a.

Incidentally, on the reference plane 4a, if one or both of the first chip 2 and the second chip 3 are disposed biasedly at an end of the reference plane 4a, in a case where stresses are applied to the first chip 2 and the second chip 3 from various directions, stresses applied to one or both of the first element arrangement area A2 and the second element arrangement area A3 have large variations. However, according to the present example embodiment, the first chip 2 and the second chip 3 are disposed such that, when viewed from the Z direction, the virtual straight line L2 passing through the barycenter C2 of the first chip 2 and the barycenter C3 of the second chip 3 is in parallel with the direction of alignment of the first chip 2 and the second chip 3 i.e. the Y direction. In other words, in the present example embodiment, the first chip 2 and the second chip 3 are aligned so as not to be biased to an end of the reference plane 4a. Therefore, according to the present example embodiment, it is possible to reduce variations in the stresses to be applied to the first element arrangement area A2 and the second element arrangement area A3.

According to the present example embodiment, the plurality of first pads 21 of the first chip 2 are disposed in the vicinity of the both ends of the first chip 2 in the longitudinal direction of the first chip 2. According to the present example embodiment, when compared to the case of disposing the plurality of first pads 21 in the vicinity of the both ends of the first chip 2 in a transverse direction of the first chip 2, the aspect ratio (the ratio of a dimension in the short-length direction to a dimension in the long-length direction) of the first element arrangement area A2 can be reduced, on condition that the planar shape of the first chip 2 is unchanged. Therefore, according to the present example embodiment, ends of the first element arrangement area A2 can be distant from ends of the reference plane 4a, and as a result, it is possible to reduce variations in the stress applied to the first element arrangement area A2.

Similarly, according to the present example embodiment, the plurality of second pads 31 of the second chip 3 are disposed in the vicinity of the both ends of the second chip 3 in the longitudinal direction of the second chip 3. According to the present example embodiment, when compared to the case of disposing the plurality of second pads 31 in the vicinity of both ends of the second chip 3 in a transverse direction of the second chip 3, the aspect ratio of the second element arrangement area A3 can be reduced, on condition that the planar shape of the second chip 3 is unchanged. Therefore, according to the present example embodiment, ends of the second element arrangement area A3 can be distant from the ends of the reference plane 4a, and as a result, it is possible to reduce variations in the stress applied to the second element arrangement area A3.

Note that the technology is not limited to the foregoing embodiment but changeable in various ways. For example, the magnetic sensor device and the magnetic sensor system according to the technology are applicable not only to the case of detecting the relative position of the magnetic field generator with respect to the magnetic sensor device but also to the case of detecting the posture of the magnetic sensor device that is configured to be rotatable in a predetermined magnetic field.

The plurality of second MR elements 50B of the second magnetic sensor 20 and the plurality of third MR elements 50C of the third magnetic sensor 30 may be formed not only in the inclined surfaces 33a and 33b of each of the plurality of groove sections 33c but also in inclined surfaces of each of a plurality of protrusions protruding from the top surface of the insulating layer 33 in the Z direction.

The second chip 3 may include two magnetic sensors used for generating detection values corresponding to a component of the external magnetic field in a direction parallel to the Y direction and a component of the external magnetic field in a direction parallel to the Z direction, instead of the second and third magnetic sensors 20 and 30.

The first chip 2 may include a magnetic sensor used for generating a detection value corresponding to a component of the external magnetic field in a direction parallel to the Y direction, instead of the first magnetic sensor 10, and the second chip 3 may include two magnetic sensors used for generating a detection value corresponding to a component of the external magnetic field in a direction parallel to the X direction and a detection value corresponding to a component of the external magnetic field in a direction parallel to the Z direction, instead of the second and third magnetic sensors 20 and 30.

Each of the first to third magnetic sensors 10, 20, and 30 may include a half bridge circuit constituted of two resistor sections, instead of a Wheatstone bridge circuit constituted of four resistor sections. In this case, each of the first to third magnetic sensors 10, 20, and 30 may generate a detection signal that has a correspondence with a component of the external magnetic field in a predetermined direction.

The magnetic detection element according to the technology may be any element as long as the element has the function of detecting a magnetic field. Accordingly, the magnetic detection element is not limited to the spin-valve MR element, but is a concept including an anisotropic magnetoresistive element (AMR element), a Hall element (planar Hall element and vertical Hall element), and the like.

The processor 40 may not be included in the support 4, and may not be integrated with the first and second chips 2 and 3.

It is apparent that various aspects and modification examples of the technology can be implemented based on the above description. Accordingly, the technology can be implemented in modes other than the best mode described above within the scope of claims and equivalents thereto.

What is claimed is:

1. A magnetic sensor device comprising:
a first chip including a first magnetic sensor,
a second chip including a second magnetic sensor and a third magnetic sensor, and
a support having a reference plane, wherein
the first magnetic sensor includes at least one first magnetic detection element and detects a first component of an external magnetic field, and the first component is a component of the external magnetic field in a first direction being a direction parallel to the reference plane, the second magnetic sensor includes at least one second magnetic detection element and detects a second component of the external magnetic field, and the second component is a component of the external magnetic field in a second direction being a direction inclined with respect to each of the reference plane and a direction perpendicular to the reference plane, the third magnetic sensor includes at least one third magnetic detection element and detects a third component of the external magnetic field, and the third component is a component of the external magnetic field in a third direction being another direction inclined with respect to each of the reference plane and the direction perpendicular to the reference plane, the first chip and the second chip are mounted on the reference plane, and each of the first chip and the second chip has a shape that is longer in a direction orthogonal to a direction of alignment of the first chip and the second chip, when viewed from the direction perpendicular to the reference plane.

2. The magnetic sensor device according to claim 1, wherein the at least one first magnetic detection element is disposed on a flat surface that is parallel to the reference plane, and the at least one second magnetic detection element and the at least one third magnetic detection element are disposed on an inclined surface that is inclined with respect to the reference plane.

3. The magnetic sensor device according to claim 1, wherein the first chip and the second chip are disposed with a predetermined gap therebetween.

4. The magnetic sensor device according to claim 3, wherein the first chip and the second chip are disposed such that, when viewed from the direction perpendicular to the reference plane, a virtual straight line passing through the gap and having the same distance from the first chip and from the second chip does not cross a barycenter of the support.

5. The magnetic sensor device according to claim 1, wherein the first chip viewed from the direction perpendicular to the reference plane is smaller in size than the second chip viewed from the direction perpendicular to the reference plane.

6. The magnetic sensor device according to claim 5, wherein the first chip includes a first element arrangement area in which the at least one first magnetic detection element is disposed, the second chip includes a second element arrangement area in which the at least one second magnetic detection element and the at least one third magnetic detection element are disposed, and the first element arrangement area is ½ or less of the second element arrangement area in size.

7. A magnetic sensor device comprising:
a first chip including a first magnetic sensor,
a second chip including a second magnetic sensor and a third magnetic sensor, and
a support having a reference plane, wherein
the first magnetic sensor includes at least one first magnetic detection element and detects a first component of an external magnetic field, and the first component is a component of the external magnetic field in a first direction being a direction parallel to the reference plane, the second magnetic sensor includes at least one second magnetic detection element and detects a second component of the external magnetic field, and the second component is a component of the external magnetic field in a second direction being a direction inclined with respect to each of the reference plane and a direction perpendicular to the reference plane, the third magnetic sensor includes at least one third magnetic detection element and detects a third component of the external magnetic field, and the third component is a component of the external magnetic field in a third direction being another direction inclined with respect to each of the reference plane and the direction perpendicular to the reference plane, the first chip and the second chip are mounted on the reference plane, each of the first chip and the second chip has a planar shape that is longer in a direction, when viewed from the direction perpendicular to the reference plane, the first chip has a plurality of first pads disposed in a vicinity of both ends of the first chip in a longitudinal direction of the first chip, and the second chip has a plurality of second pads disposed in a vicinity of both ends of the second chip in a longitudinal direction of the second chip.

8. The magnetic sensor device according to claim 7, wherein the at least one first magnetic detection element is disposed on a flat surface that is parallel to the reference plane, and the at least one second magnetic detection element and the at least one third magnetic detection element are disposed on an inclined surface that is inclined with respect to the reference plane.

9. The magnetic sensor device according to claim 7, wherein the first chip and the second chip are disposed with a predetermined gap therebetween.

10. The magnetic sensor device according to claim 9, wherein the first chip and the second chip are disposed such that, when viewed from the direction perpendicular to the reference plane, a virtual straight line passing through the gap and having the same distance from the first chip and from the second chip does not cross a barycenter of the support.

11. The magnetic sensor device according to claim 7, wherein the first chip viewed from the direction perpendicular to the reference plane is smaller in size than the second chip viewed from the direction perpendicular to the reference plane.

12. The magnetic sensor device according to claim 11, wherein the first chip includes a first element arrangement area in which the at least one magnetic detection element is disposed, the second chip includes a second element arrangement area in which the at least one second magnetic detection element and the at least one third magnetic detection element are disposed, and the first element arrangement area is ½ or less of the second element arrangement area in size.

13. The magnetic sensor device according to claim 7, wherein the planar shape of each of the first chip and the second chip is long in a direction orthogonal to a direction of alignment of the first chip and the second chip.

14. The magnetic sensor device according to claim 7, wherein each of the first chip and the second chip is disposed such that, when viewed from the direction perpendicular to the reference plane, a virtual straight line passing through a barycenter of the first chip and a barycenter of the second chip is in parallel with the direction of alignment of the first chip and the second chip.

15. The magnetic sensor device according to claim 7, wherein
the support has a plurality of third pads disposed on the reference plane,
part of the plurality of third pads is disposed on both sides of the first chip in the longitudinal direction of the first chip, and
other part of the plurality of third pads is disposed on both sides of the second chip in the longitudinal direction of the second chip.

16. The magnetic sensor device according to claim 7, wherein
the second chip includes a second element arrangement area in which the at least one second magnetic detection element and the at least one third magnetic detection element are disposed, and
when viewed from the direction perpendicular to the reference plane, the second element arrangement area has a planar shape long in a direction orthogonal to a longitudinal direction of the planar shape of the second chip.

17. The magnetic sensor device according to claim 7, wherein a dimension of the first chip in the direction perpendicular to the reference plane and a dimension of the second chip in the direction perpendicular to the reference plane are the same.

18. The magnetic sensor device according to claim 7, wherein a dimension of the support in the direction perpendicular to the reference plane is larger than a dimension of the first chip in the direction perpendicular to the reference plane and a dimension of the second chip in the direction perpendicular to the reference plane.

19. The magnetic sensor device according to claim 7, wherein
the first magnetic sensor generates at least one first detection signal having a correspondence with the first component,
the second magnetic sensor generates at least one second detection signal having a correspondence with the second component,
the third magnetic sensor generates at least one third detection signal having a correspondence with the third component,
the support includes a processor, and
the processor generates a first detection value corresponding to the first component based on the at least one first detection signal, and also generates a second detection value corresponding to a component of the external magnetic field in a direction parallel to the reference plane and orthogonal to the first direction and a third detection value corresponding to a component of the external magnetic field in the direction perpendicular to the reference plane based on the at least one second detection signal and the at least one third detection signal.

20. The magnetic sensor device according to claim 7, wherein the support includes a processor configured to perform arithmetic using a plurality of detection signals generated by the first to third magnetic sensors.

21. The magnetic sensor device according to claim 20, wherein the processor is constructed of an ASIC.

22. The magnetic sensor device according to claim 20, wherein the magnetic sensor device is mounted on a printed board by the support being bonded to the printed board.

23. A magnetic sensor system comprising:
the magnetic sensor device according to claim 7; and
a magnetic field generator that generates a predetermined magnetic field, wherein
a relative position of the magnetic field generator with respect to the magnetic sensor device is changeable along a predetermined spherical surface.

24. A magnetic sensor device comprising:
a first chip including a first magnetic sensor,
a second chip including a second magnetic sensor and a third magnetic sensor, and
a support having a reference plane, wherein
the first magnetic sensor includes at least one first magnetic detection element and detects a first component of an external magnetic field, and the first component is a component of the external magnetic field in a first direction being a direction parallel to the reference plane,
the second magnetic sensor includes at least one second magnetic detection element and detects a second component of the external magnetic field, and the second component is a component of the external magnetic field in a second direction being a direction parallel to the reference plane and being different from the first direction,
the third magnetic sensor includes at least one third magnetic detection element and detects a third component of the external magnetic field, and the third component is a component of the external magnetic field in a third direction being a direction perpendicular to the reference plane,
the first chip and the second chip are mounted on the reference plane, and
each of the first chip and the second chip has a shape long in a direction orthogonal to a direction of alignment of the first chip and the second chip, when viewed from the direction perpendicular to the reference plane.

25. The magnetic sensor device according to claim 24, wherein the first chip and the second chip are disposed with a predetermined gap therebetween.

26. The magnetic sensor device according to claim 25, wherein the first chip and the second chip are disposed such that, when viewed from the direction perpendicular to the reference plane, a virtual straight line passing through the gap and having the same distance from the first chip and from the second chip does not cross a barycenter of the support.

27. The magnetic sensor device according to claim 24, wherein the first chip viewed from the direction perpendicular to the reference plane is smaller in size than the second chip viewed from the direction perpendicular to the reference plane.

28. The magnetic sensor device according to claim 27, wherein
the first chip includes a first element arrangement area in which the at least one magnetic detection element is disposed,
the second chip includes a second element arrangement area in which the at least one second magnetic detection element and the at least one third magnetic detection element are disposed, and the first element arrangement area is ½ or less of the second element arrangement area in size.

29. The magnetic sensor device according to claim 24, wherein each of the first chip and the second chip is disposed such that, when viewed from the direction perpendicular to the reference plane, a virtual straight line passing through a barycenter of the first chip and a barycenter of the second chip is in parallel with the direction of alignment of the first chip and the second chip.

30. The magnetic sensor device according to claim 24, wherein
the first chip has a plurality of first pads disposed in a vicinity of both ends of the first chip in a longitudinal direction of the first chip, and
the second chip has a plurality of second pads disposed in a vicinity of both ends of the second chip in a longitudinal direction of the second chip.

31. The magnetic sensor device according to claim 24, wherein
the support has a plurality of third pads disposed on the reference plane,
part of the plurality of third pads is disposed on both sides of the first chip in the longitudinal direction of the first chip, and
other part of the plurality of third pads is disposed on both sides of the second chip in the longitudinal direction of the second chip.

32. The magnetic sensor device according to claim 24, wherein
the second chip includes a second element arrangement area in which the at least one second magnetic detection element and the at least one third magnetic detection element are disposed, and
when viewed from the direction perpendicular to the reference plane, the second element arrangement area has a planar shape long in a direction orthogonal to a longitudinal direction of a planar shape of the second chip.

33. The magnetic sensor device according to claim 24, wherein a dimension of the first chip in the direction perpendicular to the reference plane and a dimension of the second chip in the direction perpendicular to the reference plane are the same.

34. The magnetic sensor device according to claim 24, wherein a dimension of the support in the direction perpendicular to the reference plane is larger than a dimension of the first chip in the direction perpendicular to the reference plane and a dimension of the second chip in the direction perpendicular to the reference plane.

35. The magnetic sensor device according to claim 24, wherein
the first magnetic sensor generates at least one first detection signal having a correspondence with the first component,
the second magnetic sensor generates at least one second detection signal having a correspondence with the second component,
the third magnetic sensor generates at least one third detection signal having a correspondence with the third component,
the support includes a processor, and
the processor generates a first detection value corresponding to the first component based on the at least one first detection signal,
generates a second detection value corresponding to the second component based on the at least one second detection signal, and
generates a third detection value corresponding to the third component based on the at least one third detection signal.

36. The magnetic sensor device according to claim 24, wherein the support includes a processor configured to perform arithmetic using a plurality of detection signals generated by the first to third magnetic sensors.

37. The magnetic sensor device according to claim 36, wherein the processor is constructed of an ASIC.

38. The magnetic sensor device according to claim 36, wherein the magnetic sensor device is mounted on a printed board by the support being bonded to the printed board.

39. A magnetic sensor system comprising:
the magnetic sensor device according to claim 24; and
a magnetic field generator that generates a predetermined magnetic field, wherein
a relative position of the magnetic field generator with respect to the magnetic sensor device is changeable along a predetermined spherical surface.

* * * * *